US012642100B2

(12) United States Patent (10) Patent No.: US 12,642,100 B2
Gruber et al. (45) Date of Patent: May 26, 2026

(54) SEMICONDUCTOR DEVICE HAVING A BACKSIDE METALLIZATION LAYER AND A PROTECTION LAYER

(71) Applicant: Infineon Technologies AG, Neubiberg (DE)

(72) Inventors: Christian Gruber, Finkenstein (AT); Benjamin Bernard, Woerth (DE); Tobias Polster, Villach (AT); Carsten von Koblinski, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/774,282

(22) Filed: Jul. 16, 2024

(65) Prior Publication Data

US 2024/0371793 A1 Nov. 7, 2024

Related U.S. Application Data

(60) Continuation of application No. 18/106,028, filed on Feb. 6, 2023, now Pat. No. 12,094,837, which is a
(Continued)

(30) Foreign Application Priority Data

Nov. 12, 2019 (EP) ..................................... 19208697

(51) Int. Cl.
 *H01L 23/00* (2006.01)
 *H01L 21/768* (2006.01)
(Continued)

(52) U.S. Cl.
 CPC ...... *H01L 23/562* (2013.01); *H01L 21/76802* (2013.01); *H01L 21/76877* (2013.01); *H01L 21/78* (2013.01); *H01L 23/5386* (2013.01)

(58) Field of Classification Search
 CPC ............. H01L 23/562; H01L 21/76802; H01L 21/76877; H01L 21/78; H01L 23/5386; H01L 21/561; H01L 23/3107; H01L 23/3121; H01L 2221/68327; H01L 2221/6834; H01L 21/6835; H01L 23/3178;
(Continued)

(56) References Cited

U.S. PATENT DOCUMENTS 6,787,389 B1 9/2004 Oohira et al.
2003/0011079 A1 1/2003 Takano et al.
(Continued)

FOREIGN PATENT DOCUMENTS

WO 2017148873 A1 9/2017
WO WO-2019066997 A1 * 4/2019 ......... H01L 21/4871

*Primary Examiner* — Thanh T Nguyen
(74) *Attorney, Agent, or Firm* — Murphy, Bilak & Homiller, PLLC

(57) ABSTRACT

A semiconductor device includes: a semiconductor die having a front side surface, a backside surface opposite the front side surface, and side faces; a backside metallization layer at least partly covering the backside surface of the semiconductor die and projecting laterally outwards beyond the side faces of the semiconductor die; and a protection layer at least partly covering the side faces of the semiconductor die. The backside metallization layer projects laterally outwards beyond the protection layer.

19 Claims, 6 Drawing Sheets

Related U.S. Application Data division of application No. 17/071,022, filed on Oct. 15, 2020, now Pat. No. 11,605,599.

(51) Int. Cl.
  *H01L 21/78*       (2006.01)
  *H01L 23/538*      (2006.01)

(58) Field of Classification Search
  CPC .... H01L 23/3185; B23K 26/38; H10D 62/10;
                                        H10D 62/104
  See application file for complete search history.

(56)                 References Cited

U.S. PATENT DOCUMENTS

| | | | |
|---|---|---|---|
| 2004/0113283 A1 | 6/2004 | Farnworth et al. | |
| 2010/0052142 A1 | 3/2010 | Tojo et al. | |
| 2010/0052185 A1 | 3/2010 | Tojo et al. | |
| 2012/0273819 A1* | 11/2012 | Lin ..................... | H10H 20/853 |
| | | | 257/E33.072 |
| 2013/0049205 A1 | 2/2013 | Meyer et al. | |
| 2015/0115448 A1 | 4/2015 | Maier | |
| 2016/0379926 A1 | 12/2016 | Howard et al. | |
| 2017/0263589 A1 | 9/2017 | Chang Chien et al. | |
| 2018/0204786 A1* | 7/2018 | Rodriguez .............. | H01L 24/83 |
| 2019/0088550 A1 | 3/2019 | Ganitzer et al. | |
| 2019/0304927 A1* | 10/2019 | Kim .................. | H01L 23/49816 |
| 2020/0091000 A1 | 3/2020 | Seddon | |
| 2020/0312782 A1* | 10/2020 | Eid ......................... | H01L 24/03 |

* cited by examiner

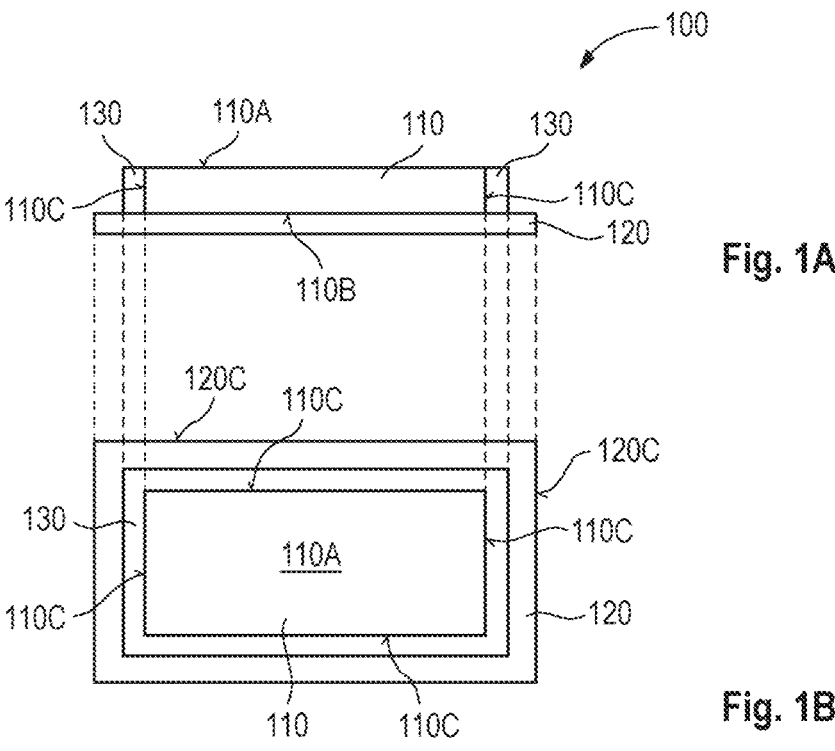
Fig. 1A
Fig. 1B
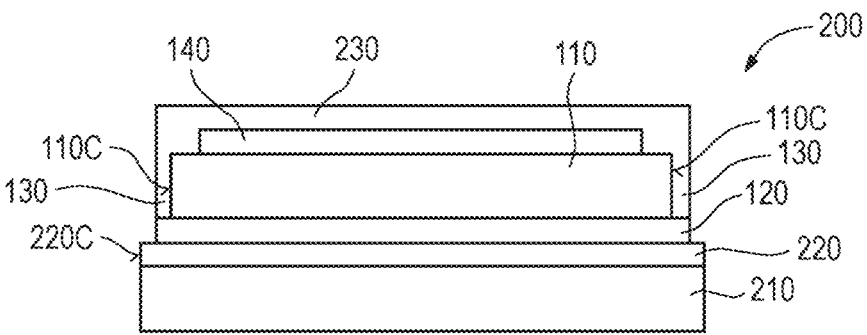
Fig. 2

| | |
|---|---|
| | -31.8844 MPa |
| | 1.90769 MPa |
| | 35.6997 MPa |
| | 69.4918 MPa |
| | 103.248 MPa |
| | 137.076 MPa |
| | 170.868 MPa |
| | 204.66 MPa |
| | 238.452 MPa |

| | |
|---|---|
| | -30.6093 MPa |
| | -12.4951 MPa |
| | 5.61912 MPa |
| | 23.7334 MPa |
| | 41.8476 MPa |
| | 59.9618 MPa |
| | 78.0761 MPa |
| | 96.1903 MPa |
| | 114.305 MPa |

SEMICONDUCTOR DEVICE HAVING A BACKSIDE METALLIZATION LAYER AND A PROTECTION LAYER

TECHNICAL FIELD

This disclosure relates generally to the field of semiconductor devices, and in particular to the field of semiconductor devices including thin semiconductor dies.

BACKGROUND

Thin dies bear the risk of die cracks during device manufacturing, in particular during mounting the die on a device carrier. While a small die thickness is favorable in view of obtaining enhanced device performance, thin dies are more prone to damage such as corner cracks or die edge chipping than dies of conventional thickness. Hence, reducing the die thickness increases the risks on die integrity especially during packaging and may cause yield losses during production or early failures in the field.

SUMMARY

According to an aspect of the disclosure, a semiconductor device includes a semiconductor die comprising a front side surface, a backside surface opposite the front side surface and side faces. A backside metallization layer is deposited over the backside surface and projects laterally outwards beyond the side faces. A side face protection layer covers the side faces.

According to another aspect of the disclosure, a semiconductor arrangement includes a semiconductor device of any of the preceding claims. The semiconductor arrangement further includes a device carrier and a solder layer arranged between the device carrier and the backside metallization layer to mount the semiconductor device to the device carrier. In a vertical projection an outline of the solder layer surrounds an outline of the side faces.

According to still another aspect of the disclosure, a method of manufacturing a semiconductor device comprises forming grooves in a front side surface of a wafer. The grooves are filled with a first side face protection material. The wafer is thinned at a backside surface of the wafer opposite the front side surface. A backside metallization layer is deposited over the backside surface of the thinned wafer. Laser cutting is performed along the grooves through the side face protection material and through the backside metallization layer to separate the wafer into multiple semiconductor devices.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required.

Embodiments are depicted in the drawings and are exemplarily detailed in the description which follows.

FIG. 1A is a schematic cross-sectional illustration of an exemplary semiconductor device.

FIG. 11B is a schematic top view of the exemplary semiconductor device of FIG. 1A.

FIG. 2 is a schematic cross-sectional illustration of an exemplary semiconductor arrangement showing an exemplary semiconductor device soldered to a device carrier.

DETAILED DESCRIPTION

Figure 3A:
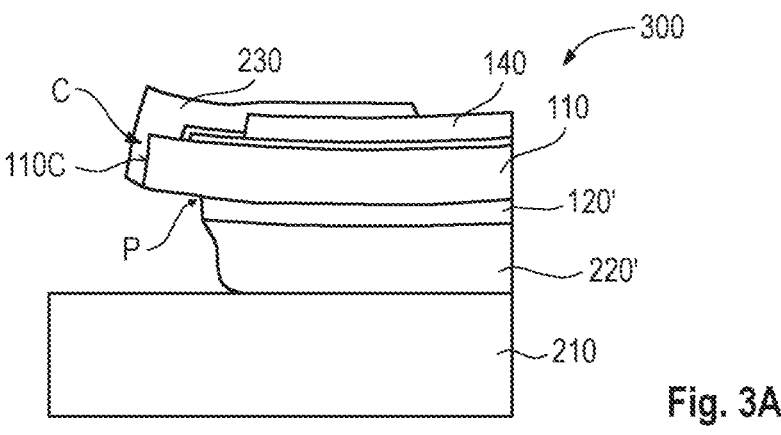
FIG. 3A is a schematic partial cross-sectional illustration of a semiconductor arrangement including a semiconductor device having a backside metallization layer which ends laterally beneath the semiconductor die, which is soldered to a device carrier.

It is to be understood that the features of the various exemplary embodiments and examples described herein may be combined with each other, unless specifically noted otherwise.

As used in this specification, the terms "deposited", "covered by", or "applied" or similar terms are not meant to mean that the elements or layers must directly be contacted together; intervening elements or layers may be provided between the "deposited", "covered by", or "applied" elements, respectively. However, in accordance with the disclosure, the above-mentioned and similar terms may, optionally, also have the specific meaning that the elements or layers are directly contacted together, i.e. that no intervening elements or layers are provided between the "deposited", "covered by", or "applied" elements, respectively.

Further, the words "over" or "beneath" with regard to a part, element or material layer formed or located or arranged "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located or arranged "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

In particular, power and/or high voltage semiconductor devices are disclosed herein. They may involve semiconductor dies having a vertical or horizontal structure. A semiconductor die having a vertical structure means that the die may be fabricated in such a way that electric currents are flowing in a direction perpendicular to the main faces of the semiconductor die. A semiconductor chip having a vertical structure usually has load electrodes on its two main faces, that is to say on its top side and bottom side (the bottom side is also referred to as backside herein). In this case, a backside metallization layer usually serves as a load electrode of the semiconductor die. On the contrary, in a semiconductor die having a horizontal structure the electrical currents are flowing in a direction parallel to the main faces of the semiconductor die, and the load electrodes are usually placed on the front main face of the semiconductor die. In this case, a backside metallization layer often serves as a heat removal layer without electrical function as a load electrode.

The semiconductor die may, for example, be configured as an IGBT (Insulated Gate Bipolar Transistor), a FET (Field Effect Transistor), in particular a MOSFET (Metal Oxide Semiconductor FET), a JFET (Junction Gate FET), a thyristor, specifically a GTO (Gate Turn-Off) thyristor, a BJT (Bipolar Junction Transistor), an HEMT (High Electron Mobility Transistor), or a diode. By way of example, a source electrode and a gate electrode of, e.g., a FET or MOSFET may be situated on the front side main face, while the drain electrode of the FET or MOSFET may be arranged on the backside main face.

FIGS. 1A and 1B illustrate an example of a semiconductor device 100. The semiconductor device 100 includes a semiconductor die 110 having a front side surface 110A and a backside surface 110B. Further, the semiconductor die 110 has side faces 110C extending between the front side surface 110A and the backside surface 110B.

The backside surface 110B of the semiconductor die 100 is covered by a backside metallization layer 120 deposited over the backside surface 110B of the semiconductor day 110. The backside metallization layer 120 projects laterally outward beyond the side faces 110C of the semiconductor die 110. The backside metallization layer 120 may comprise or be made of a metal such as, e.g., Cu or Al or an alloy (e.g. AlCu, AlSiCu, etc.) of one or more of the aforementioned metals.

As apparent from FIG. 1B, the backside metallization layer 120 may project beyond the side faces 110C in all lateral directions. That is, in a vertical projection an outline 120C of the backside metallization layer 120 may surround an outline of the side faces 110C.

The backside metallization layer 120 may serve as an electrode (i.e. die pad) on the semiconductor die 110 and/or may provide for an efficient thermal coupling of the semiconductor die 110 to a heat sink or other heat dissipation tools.

The side faces 110C are covered by a side face protection layer 130. The side face protection layer 130 may completely cover the side faces 110C of the semiconductor die 110. This means that either the entire circumferential dimension of the side faces 110C or the entire vertical dimension of the side faces 110C or both are completely covered by the side face protection layer 130.

The side face protection layer 130 may be a polymer layer, i.e. may comprise or be of a polymer material. By way of example, the polymer material may be an insulating polymer such as an epoxy or a resin. However, it is also possible that the side face protection layer 130 comprises or consists of a ceramic material, such as a ceramic material including an oxide (e.g. silicon oxide) or a nitride (e.g. silicon nitride).

As will be described in more detail further below, the side face protection layer 130 may be generated by separating (e.g. laser cutting) a regular array of dies 110 which are separated from each other by (half-cut) dicing streets filled with a filler material—namely the material of the side face protection layer 130. Process flows which may be used to generate the side face protection layer 130, as shown in FIGS. 1A and 1B, are known as DBG (dicing before grinding) or (plasma) etching before grinding processes and will be described further below.

During packaging, the semiconductor device 100 may be soldered to a device carrier. FIG. 2 illustrates a semiconductor arrangement 200 which includes a semiconductor device 100 soldered to a device carrier 210. To that end, a solder layer 220 is arranged between the device carrier 210 and the backside metallization layer 120 of the semiconductor device 100.

The solder layer 220 may have a lateral extension defined by solder layer side faces 220C. The solder layer side faces 220C may project laterally outwards beyond the side faces 110C of the semiconductor die 110. In other words, in a vertical projection an outline of the solder layer 220 (as defined by the solder layer side faces 220C) may surround an outline of the semiconductor die as defined by the side faces 110C.

Hence, the semiconductor die 110 may be supported over its full edge region (and in many cases also across its entire backside surface 110B) by the backside metallization layer 120 and by the solder layer 220. As will be explained in more detail further below, this concept of die edge support allows to reduce the thickness of the semiconductor die 110 considerably without simultaneously increasing the risk of die corner cracks or die edge chipping. This concept opens the door to ultra-thin chip technology and allows to produce semiconductor devices 100 and semiconductor arrangements 200 of improved electrical and thermal performance, e.g. of low ohmic resistance $RS_{ON}$ and, hence, low-power losses.

The device carrier 210 may be a leadframe or any other kind of device carrier such as, e.g., a ceramic-based device carrier (e.g. a DBC (direct bonded copper) substrate) or a PCB (printed circuit board).

Further, FIG. 2 illustrates by way of example that the semiconductor die 110 may be equipped with a front side metallization layer 140. The front side metallization layer 140 may cover a major part of the front side surface 110A of the semiconductor 110. The front side metallization layer 140 may be made of one or more of the materials mentioned with respect to the backside metallization layer 120. It may, e.g., be made of the same material as the backside metallization layer 120 or, as will be exemplified further below, be made of another metal material than the backside metallization layer 120.

Further, the side face protection layer 130 is shown in FIG. 2 not only to cover the side faces 110C of the semiconductor die 110 but also to cover the side faces of the front side metallization layer 140. Further, a top polymer layer 230 may cover the front side surface 110A of the semiconductor die 110 and (optionally) the top surface of the front side metallization layer 140, if any. The top polymer layer 230 may be of the same material as the side face protection layer 130 and may, e.g., be integrally formed with the side face protection layer 130.

The top polymer layer 230 may completely cover the front side surface 110A of the semiconductor die 110 and/or the top surface of the front side metallization layer 140. The top polymer layer 230 may optionally be equipped with electrical contact holes, heat sink opening(s) or other structure (not shown) to allow electrical and/or thermal and/or mechanical access to the front side metallization layer 140 and/or to the front side surface 110A of the semiconductor die 110.

FIG. 3A illustrates a partial cross-sectional view of a comparative semiconductor device which is similar to embodiments described herein except that the backside metallization layer 120' does not project laterally outwards beyond the side faces 110C of the semiconductor die 110. On the contrary, the backside metallization layer 120' ends at an end point P beneath the semiconductor die 110, wherein the end point P is laterally spaced apart from the side face 110C over a certain distance.

Further, the solder layer 220' arranged between the device carrier 210 and the backside metallization layer 120' is arranged within the footprint of the semiconductor die 110 (i.e. a vertical projection of an outline of the side faces 110C of the semiconductor die 110 surrounds an outline of the solder layer 220').

As apparent from FIG. 3A, the semiconductor arrangement 300 exhibits (after solder reflow) a certain deformation. The edge region of the semiconductor die 110, which is not supported by the backside metallization layer 120' and the solder layer 220', is bent upward to a certain degree. The deformation of the semiconductor die 110 is shown along a diagonal direction of the semiconductor die 100. In other words, FIG. 3A illustrates the corner deformation of the semiconductor die 110.

Figure 3B:
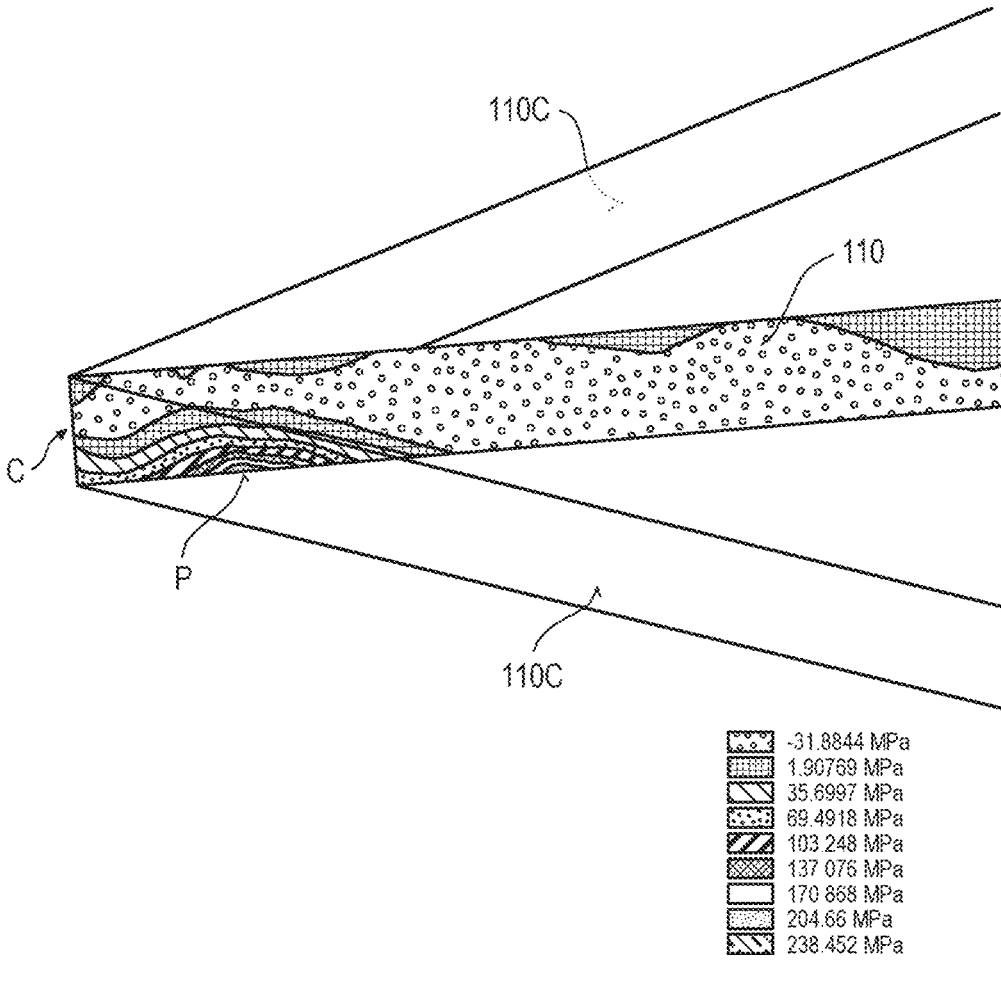
FIG. 3B illustrates stress simulation results for the semiconductor device of FIG. 3A.

FIG. 3B shows the results of a stress simulation computation performed on the semiconductor arrangement 300 (after solder reflow). The distribution of stress is depicted along the diagonal direction, i.e. as a sectional view along a 45° direction to each of the side faces 110C of the semiconductor die 110, wherein the side faces 110C meet at the semiconductor die corner C.

The simulation was performed on a silicon semiconductor die 110 having a thickness of 20 μm, a backside metallization layer 120 of Cu and an undercut (distance between the die corner C and the end point P) of 20 μm length. A maximum stress (first principal stress) was found to be 272 MPa and located at end point P. This stress in the vicinity of the die corner C is believed to be a cause of corner cracks and die edge chipping observed during, e.g., the solder reflow process of semiconductor dies 110 of small thickness.

Figure 4A:
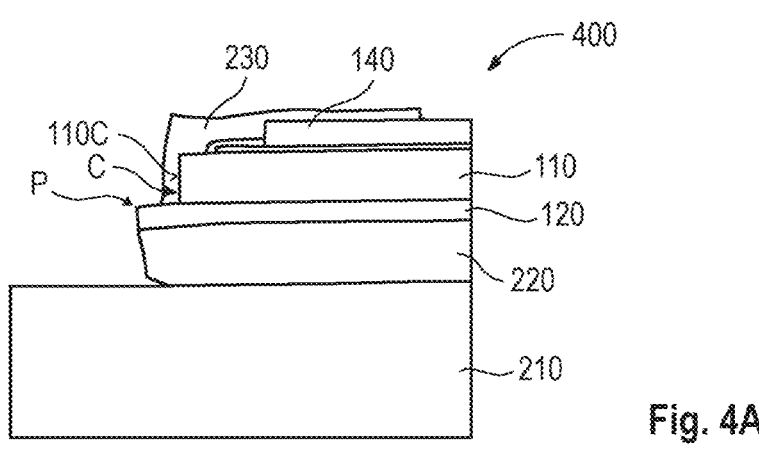
FIG. 4A is a schematic partial cross-sectional illustration of a semiconductor arrangement including a semiconductor device having a backside metallization layer which projects laterally outwards beyond the side faces of the semiconductor die, which is soldered to a device carrier.

FIG. 4A illustrates a semiconductor arrangement 400 similar to the semiconductor arrangement 300 except that the backside metallization layer 120 projects laterally outwards beyond the side faces 110C of the semiconductor die 110, see e.g. also FIGS. 1A, 1B and 2. Analogous to FIG. 3A, FIG. 4A shows a diagonal sectional view intersecting a corner C of the semiconductor die 110.

The deformation after reflow of the semiconductor die 110 is much smaller than for the semiconductor arrangement 300 shown in FIG. 3A. This is due to the fact that the full area support of the backside surface 110B of the semiconductor die 110 by the backside metallization layer 120 protects the semiconductor die 110 against the contracting force of the solder layer 220 during reflow. In other words, in the semiconductor arrangement 400 the solder layer 220 cannot exert a peak force on the semiconductor die 110 at a point near to the corner C of the semiconductor die 110, since the end point P of the backside metallization layer 120 is not in contact with (and not beneath) the semiconductor die 110.

Figure 4B:
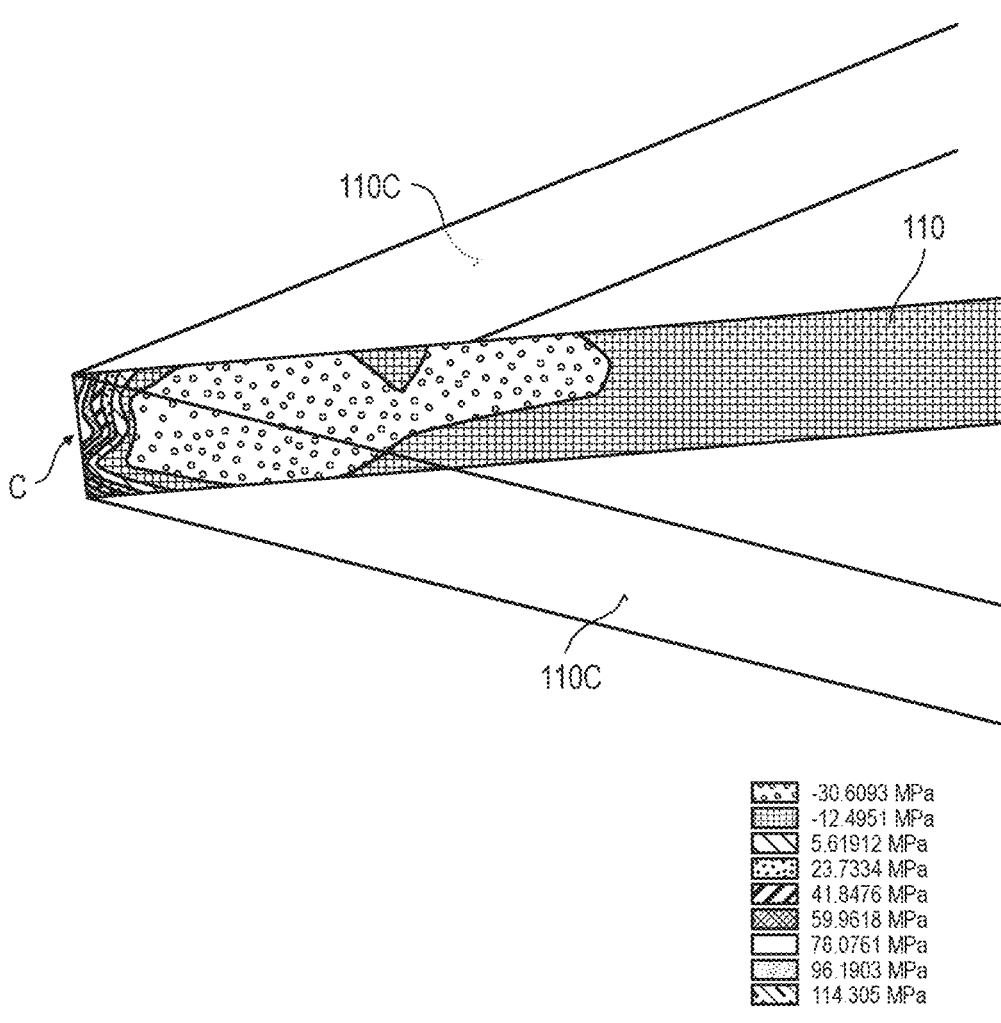
FIG. 4B illustrates stress simulation results for the semiconductor device of FIG. 4A.

FIG. 4B illustrates the simulation results for the semiconductor arrangement 400 of FIG. 4A. Again, a silicon semiconductor die 110 of a thickness of 20 μm and a backside metallization layer 120 of Cu were used. An extension of 10 μm of the backside metallization layer 120 beyond the side faces 110C of the semiconductor die 110 (i.e. a 10 μm distance between the end point P and the corner C) was used in the simulation.

As apparent from FIG. 4B, the maximum stress (first principle stress) was found to be 132 MPa located directly at the semiconductor die corner C. Differently put, the amount of stress was less than half compared to the results of the simulation shown in FIG. 3B and the maximum point of stress occurred directly at the periphery (corner C) of the semiconductor die 110 rather than at point P (FIG. 3B) at a certain distance inside the outline of the semiconductor die 110.

Figures 5A, 5B:
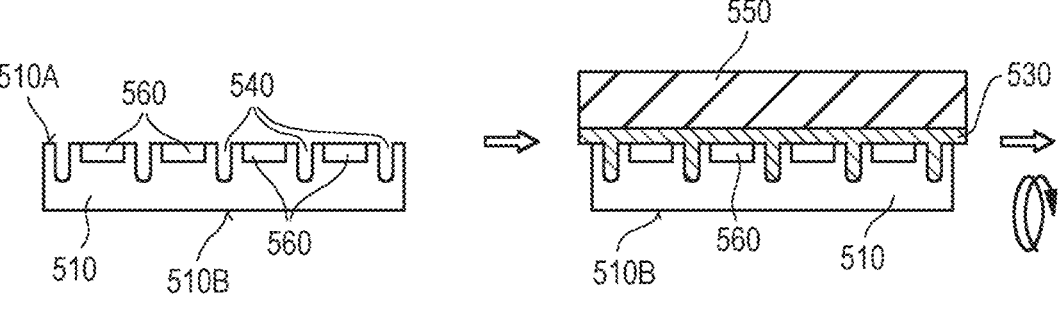
FIGS. 5A to 5F illustrate stages of an exemplary method of manufacturing a semiconductor device.

FIGS. 5A to 5F illustrate an exemplary method of manufacturing a semiconductor device such as, e.g., semiconductor device 100. FIG. 5A shows a semiconductor wafer 510 having a front side surface 510A and a backside surface 510B opposite the front side surface 510A. The semiconductor wafer 510 has been processed before so that integrated circuits (ICs) 560 (e.g. transistors, diodes, etc.) may be provided in the semiconductor wafer 510. More specifically, the semiconductor wafer 510 considered herein may be front-end processed, i.e. the ICs 560 may be monolithically integrated in each of the semiconductor wafer 510 regions destined to be cut out of the semiconductor wafer 510 to form the semiconductor die 110. The ICs 560 may, e.g., represent power ICs, logic ICs, optical ICs, MEMS (micro-electro-mechanical systems) ICs, etc. In particular, the ICs may include or form power transistors, power diodes, or other power circuitry.

The ICs 560 may have been formed at the front side surface 510A of the semiconductor wafer 510. The areas where the ICs 560 are formed are laterally spaced apart from each other by a certain distance referred to as kerf in the art.

Still referring to FIG. 5A, grooves 540 may be formed in the front side surface 510A of the semiconductor wafer 510. The grooves 540 extend to a predetermined depth in the semiconductor wafer 510 and do not extend throughout the entire thickness of the semiconductor wafer 510. The depth of the grooves 540 may be selected so as to be larger than the target thickness of the semiconductor die 110.

The grooves 540 may be formed by sawing, e.g. using a mechanical saw or by laser sawing. According to another approach, the grooves 540 may be formed by etching. Other suitable methods may also be feasible.

In various examples a front side metallization layer (not shown) is then applied to the front side surface 510A of the semiconductor wafer 510. The front side metallization layer may be formed or structured by using lithography to ensure that the grooves 540 are not filled with the metal of the front side metallization layer. By way of example, the front side metallization layer may be applied to the semiconductor wafer 510 in a way to produce the front side metallization layer 140 per semiconductor die 110 as shown in FIG. 2.

Referring to FIG. 5B the grooves 540 may then be filled with a first side face protection material 530. The first side face protection material 530 may, e.g., be applied by a printing process. The first side face protection material 530 may be applied as a continuous layer and may optionally be structured by photolithography, and may then, e.g., be thermally cured. The first side face protection material 530 may form the side face protection layer 130 of FIGS. 1A, 1B and may also form the top polymer layer 230 shown in FIGS. 2, 3A, 3B, 4A and 4B.

The semiconductor wafer 510 may be attached to a wafer mount 550. The semiconductor wafer 510 may then be thinned at the backside surface 510B. By way of example, a mechanical method such as grinding, or a chemical method such as etching or a combination of chemical and mechanical methods may be used for thinning.

Figures 5C, 5D:
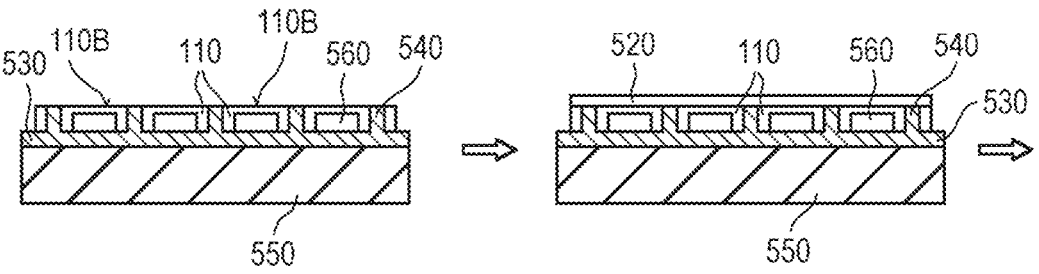

The thinning process may be carried out until the grooves 540 are opened and the first side face protection material 530 filling the grooves 540 becomes exposed, see FIG. 5C. As a result, semiconductor dies 110 are separated out of the semiconductor wafer 510. Each of the single semiconductor dies 110 is embedded in a matrix of the first side face protection material 530. The first side face protection material 530 may, e.g., cover the entire side face of the semiconductor dies 110, as described before with reference to FIGS. 1A, 1B, 2, 3A and 4A.

Further, the process of thinning the semiconductor wafer 510 may produce the backside surface 110B of the semiconductor dies 110.

FIGS. 5A to 5C are exemplary illustrations of a so-called half-cut approach which may, e.g., be performed by DBG (dicing before grinding) or by EBG (etching before grinding), in particular plasma EBG. Subsequently, the grooves 540 are filled with a filler material (e.g. polymer, ceramics, etc.) which is used to protect the side faces 110C of the semiconductor dies 110 and is therefore termed first side protection material 530.

Referring to FIG. 5D, a wafer backside metallization layer 520 is deposited over the backside surface of the thinned semiconductor wafer 510, i.e. over the backside surfaces 110B of the semiconductor dies 110 and over the first side face protection material 530 within the grooves 540. The wafer backside metallization layer 520 applied to the thinned semiconductor wafer 510 may, e.g., be applied as a continuous layer, i.e. may be left unstructured.

The generation of the backside metallization layer 520 may be performed in various ways, e.g. by electroplating (i.e. galvanic deposition) or by electroless plating (i.e. non-galvanic deposition) or other suitable deposition techniques.

Figures 5E, 5F:
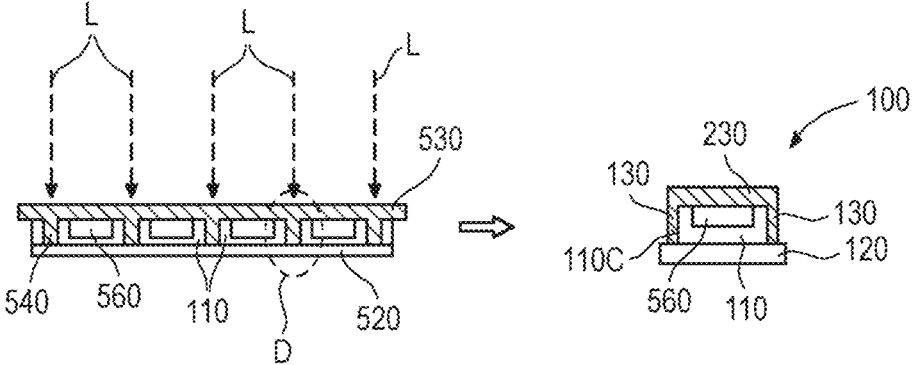

Referring to FIG. 5E, laser cutting is performed along the grooves 540 through the first side face protection material 530 and through the wafer backside metallization layer 520 to separate the thinned semiconductor wafer 510 into multiple semiconductor devices such as, e.g., semiconductor device 100. To that end, laser light L is directed onto the layer of first side face protection material 530 in alignment with the grooves 540. That way, the "composite wafer" as shown in FIG. 5E is separated into single semiconductor devices 100 as shown in FIG. 5F.

It is to be noted that the wafer backside metallization layer 520 may remain unstructured until laser cutting (FIG. 5E) is carried out. Hence, the process illustrated in FIGS. 5A through 5F may not rely on any lithography and is therefore self-aligned with the semiconductor wafer front side structure (i.e. the ICs 560 and the dicing kerfs and/or grooves 540 formed between them).

Further, the combined separation of the first side face protection material 530 and the wafer backside metallization layer 520 into side face protection layers 130 and backside metallization layers 120, respectively, allows for simultaneously shaping the backside metallization layers 120 as desired.

As a result of the combined laser cutting process, an outer side face of the side face protection layer 130 will have a laser-cut surface condition and an outer side face of the backside metallization layer 120 (corresponding to its outline 120C) will have a laser-cut surface condition. Laser-cut surface conditions of these layers can be determined e.g. by optical inspection of the semiconductor devices 100.

While the above-mentioned outer faces of the side face protection layer 130 and the backside metallization layer 120 are both formed by laser ablation, this does not necessarily mean that these outer faces are flush (although they may optionally be flush). For instance, FIG. 4A illustrates an example in which the outer side face of the top polymer layer 230 is closer to the side faces 110C of the semiconductor die 110 than the outer side face of the backside metallization layer 120. This may either be due to different laser ablation properties of the respective materials (e.g. polymer and metal) or may intentionally be produced by using different laser cuts (i.e. multi beam laser cutting: e.g. different wavelengths and/or different laser beam diameters and/or different energies, etc.) for separating the first side face protection material 530 into the side face protection layer 130 and for separating the wafer backside metallization layer 520 into the backside metallization layer 120. Differently put, laser cutting may involve single beam laser cutting or multi beam laser cutting.

Another aspect of the method exemplified in FIGS. 5A to 5F is that the side face protection layer 130 on the side faces 110C of the semiconductor dies 110 prevents ablated backside metallization layer metal from being deposited directly on the semiconductor. Hence, having a side face protection layer 130 at the side faces 110C of the semiconductor dies 110 in place, the semiconductor die 110 is protected right from the beginning of its formation (i.e. already during separation). This precludes package reliability issues, e.g. CuSi formation at elevated temperatures and/or humidity attack.

Figure 6:
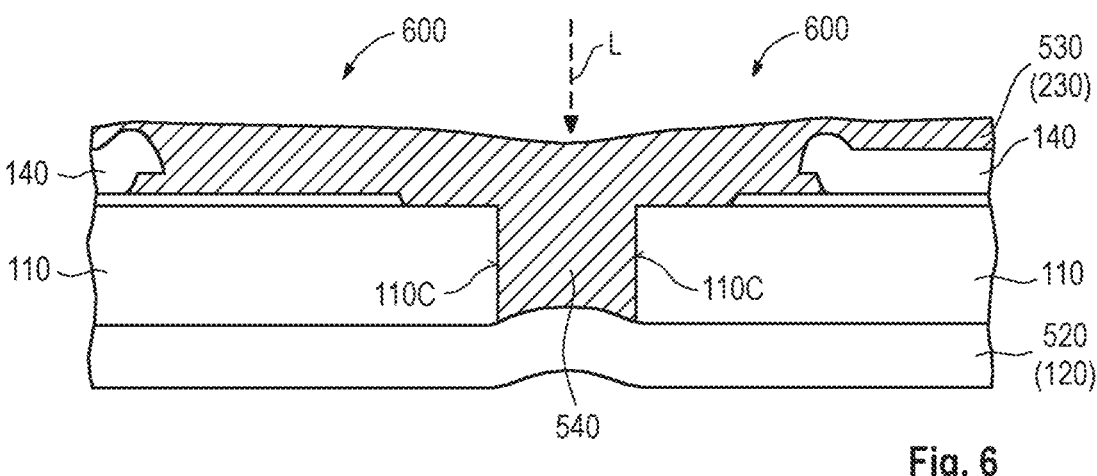
FIG. 6 is a partial cross-sectional view of structure containing a number of semiconductor devices before separation of the structure into single semiconductor devices.

FIG. 6 illustrates a partial cross-sectional view of a structure (still) containing a number of semiconductor devices 600 before separation. The partial view may correspond to the detail D of FIG. 5E before the laser cut. FIG. 6 is drawn to scale, i.e. the dimensions of the various layers and elements are exemplarily disclosed in FIG. 6.

As apparent from FIG. 6, the grinding/polishing of the semiconductor wafer 510 (see FIG. 5B) may have the effect that the (softer) polymer material of the first side face protection material 530 (e.g. epoxy) is reduced in thickness a little more than the semiconductor dies 110. Therefore, the wafer backside metallization layer 520 may to a limited extent protrude into the groove 540 between the semiconductor dies 110.

It is apparent from FIG. 6 that the laser cut along laser light L produces single semiconductor devices 600. In view of features of the semiconductor device 600, reference is made to the description of semiconductor device 100 to avoid reiteration.

Figure 7:
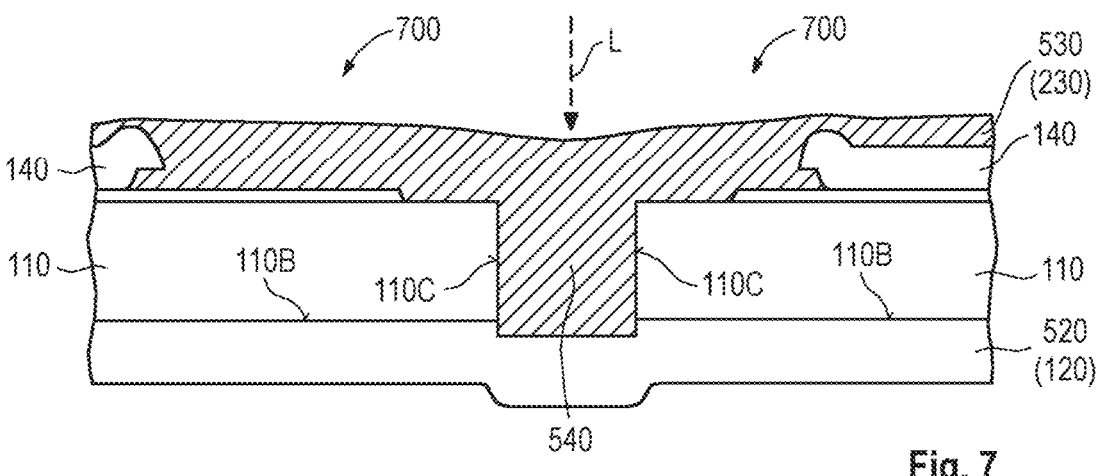
FIG. 7 is a partial cross-sectional view of a further structure containing a number of semiconductor devices before separation of the structure into single semiconductor devices.

FIG. 7 illustrates a partial cross-sectional view of a further structure (still) containing a number of semiconductor devices 700 before separation. The semiconductor devices 700 produced from the structure of FIG. 7 are similar to the semiconductor devices 600 except that the semiconductor dies 110 are reduced in thickness a little more than the polymer material of the first side face protection material 530 (e.g. epoxy). As a result, the first side face protection material 530 may to a limited extent project over the backside surfaces 110B of the semiconductor dies 110. The backside metallization layer 520 may be bent out over these projections.

This design of semiconductor device 700 may, e.g., be due to and obtained in line with the following aspects: It has been found that the backside metallization layer 520 sometimes has a weak adhesion to the semiconductor dies 110. In this case, it may be opportune to roughen the backside surfaces 110B of the semiconductor dies 110 to improve adhesion between the semiconductor dies 110 and the backside metallization layer 520. Roughening may reduce the thickness of the semiconductor dies 110 resulting in that the projections of first side face protection material 530 are formed between the semiconductor dies 110.

Roughening may be carried out between the process stage shown in FIG. 5C and the deposition of the wafer backside metallization layer 520 shown in FIG. 5D. By way of example, roughening of the backside surfaces 110B of the semiconductor dies 110 may be carried out by etching.

Figure 8:
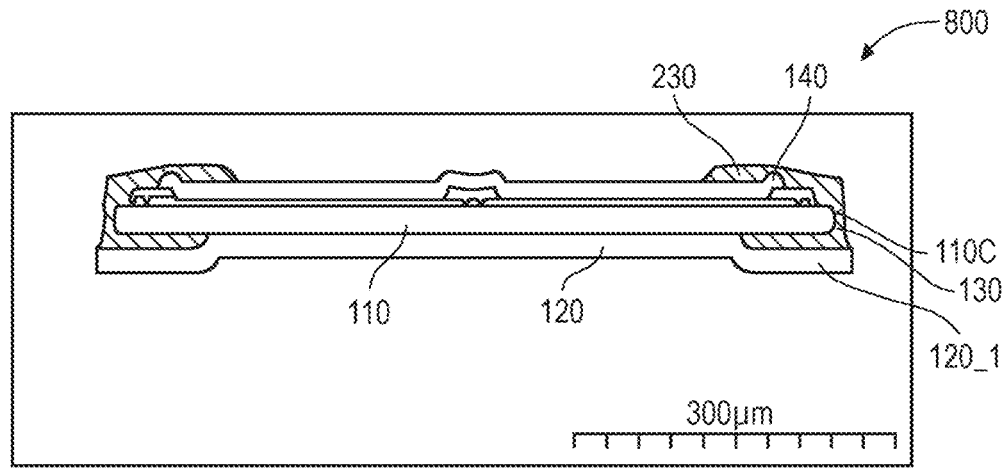
FIG. 8 is a cross-sectional contour-traced electron microscope image of an exemplary semiconductor device having a side face protection layer formed by a first sublayer and a second sublayer.
Figure 9:
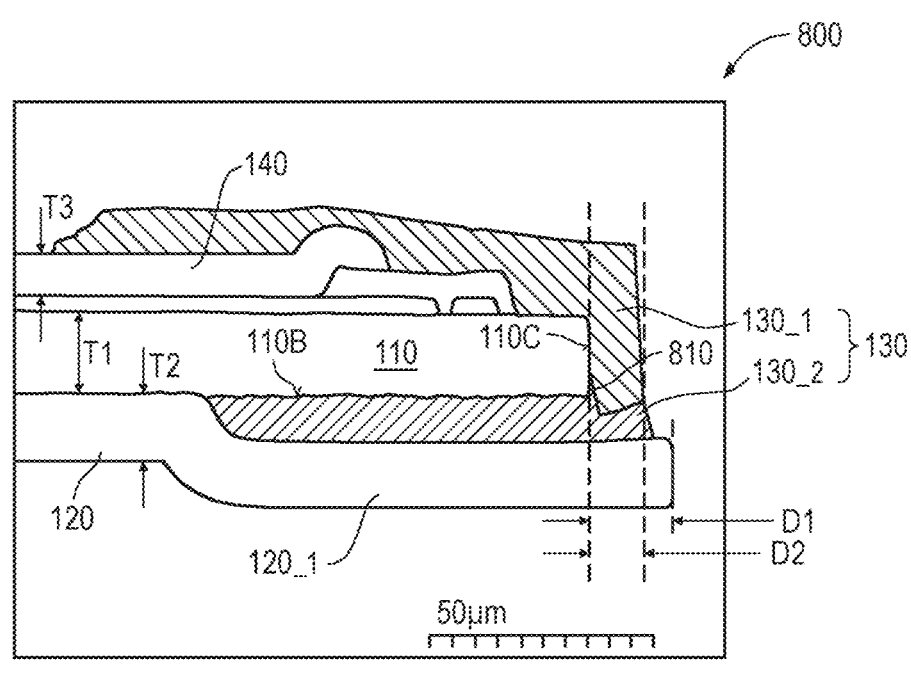
FIG. 9 is an enlarged partial section of the cross-sectional contour-traced electron microscope image of FIG. 8.
Figure 10:
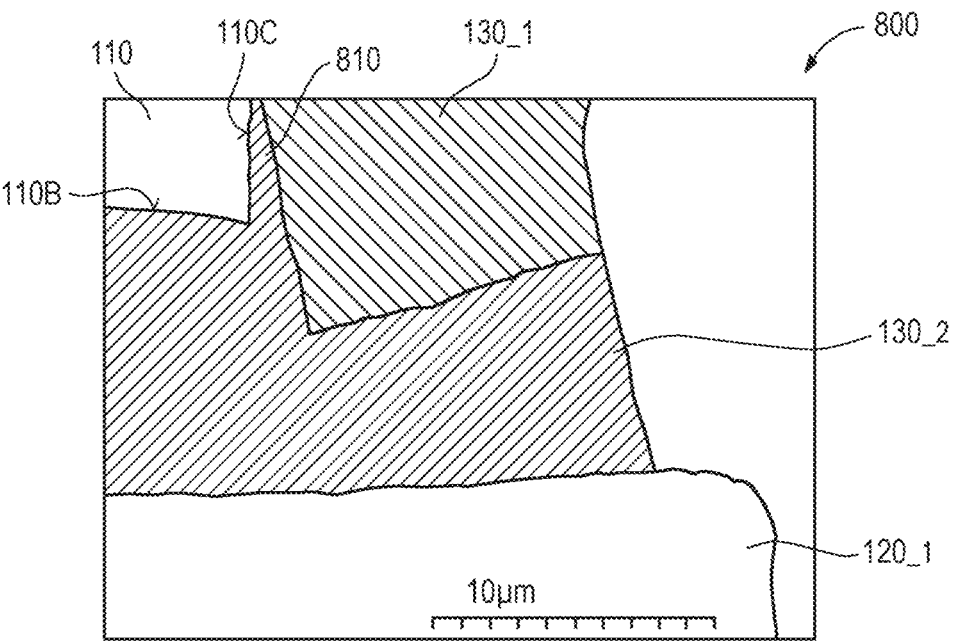
FIG. 10 is an enlarged partial section of the cross-sectional contour-traced electron microscope image of FIG. 9.

FIG. 8 is a contour-traced electron microscope image of an exemplary semiconductor device 800, and FIGS. 9 and 10 show increasingly enlarged partial sections of the semiconductor device 800. Due to their photographic nature, these Figures are also true to scale. In semiconductor device 800 the side face protection layer 130 includes a first sublayer 130_1 and a second sublayer 130_2. The first sublayer 1301 and the second sublayer 130_2 may be of the same material or of different materials. For both sublayers 130_1, 130_2 all materials or combinations of materials mentioned above with reference to the side face protection layer 130 are feasible.

As best seen in FIGS. 9 and 10, the first sublayer 130_1 overlaps with the side face 110C of the semiconductor die 110 but does not overlap with the backside surface 110B of the semiconductor die 110. On the other hand, the second sublayer 130_2 overlaps with the backside surface 110B of the semiconductor die 110 and further overlaps with an edge region between the side face 110C and the backside surface 110B of the semiconductor die 110.

In other words, the first sublayer 130_1 may be spaced apart from the lower region of the side face 110C by a wedge-shaped gap 810, and the wedge-shaped gap 810 is filled by the second sublayer 130_2.

Further, it is apparent from FIGS. 8 to 10 that a portion 120_1 of the backside metallization layer 120 is spaced apart from the backside surface 110B of the semiconductor die 110 by the second sublayer 130_2.

As mentioned earlier in conjunction with FIG. 7, e.g. roughening/etching may cause the thickness of the semiconductor die 110 to be reduces by a small amount. Further, e.g. roughening/etching may produce the gap 810 (as shown in FIG. 10) between the first side face protection material 530 (which corresponds to the first sublayer 1301 of side face protection layer 130) and the side face 110C of the semiconductor die 110. Both effects (thickness reduction and gap formation) are visible in FIGS. 9 and 10.

This gap 810 between the side face protection layer 130 and the side face 110C of the semiconductor die 110 would allow metal of the backside metallization layer 120 to get into contact with the exposed portion of the side face 110C during the application of the wafer backside metallization layer 520 as shown in FIG. 5D. Further, the difference in level between the bottom surface of the side face protection layer 130 (corresponding to the first sublayer 130_1) and the (roughened) backside surface 110B of the semiconductor die 110 would create a stepped shape of the backside metallization layer 120.

In order to avoid such implications (but also in other cases where no roughening is carried out and/or no gap is formed and/or no difference in level is obtained), the second sublayer 130_2 of the side face protection layer 130 is applied to the backside surface 110B of the semiconductor die 110 prior to depositing the wafer backside metallization layer 520.

The second sublayer 130_2 may, e.g., be applied by a printing process. As the second sublayer 130_2 is only required to protect the edge region of the semiconductor die 110, the second sublayer 1302 may, e.g., be printed in the form of a mesh only along the pattern formed by the grooves 540. The second sublayer 130_2 may also be applied as a continuous layer, then structured by photolithography and may then, e.g., be thermally cured. While the first sublayer 1301 of the side face protection layer 130 is applied from the front side surface 110A of the semiconductor die 110, the second sublayer 1302 of the side face protection layer 130 is applied from the backside surface 110B of the semiconductor die 110.

In view of further features of the semiconductor device 800, reference is made to the description of semiconductor devices 100, 600 and 700 to avoid reiteration.

In all embodiments disclosed herein, the thickness T1 (e.g. FIG. 9) of the semiconductor die 110 may be equal to or less than 60 µm, 50 µm, 40 µm, 30 µm, or 20 µm.

In all embodiments disclosed herein, the length D1 of the extension of the backside metallization layer 120 projecting over the side face 110C of the semiconductor die 110 is equal to or greater than 0 µm. The length D1 may, e.g., be equal to or greater than or less than 1 µm, 2 µm, 5 µm, 10 µm, 15 µm, or 20 µm. In many cases the extension length D1 may, e.g., be in a range between 2 µm or 5 µm as a lower range limit and 10 µm or 15 µm or 20 µm as an upper range limit.

In all embodiments disclosed herein, the distance D2 between the side face 110C of the semiconductor die 110 and the outer face of the side face protection layer 130 may, e.g., be equal to or greater than or less than 1 µm, 2 µm, 5 µm, or 10 µm.

In all embodiments disclosed herein, the backside metallization layer 120 may, e.g., have a thickness T2 equal to or greater than or less than 5 µm, 10 µm, 15 µm, or 20 µm.

In all embodiments disclosed herein, the front side metallization layer 140 may, e.g., have a thickness T3 of equal to or greater than or less than 5 µm, 10 µm, or 15 µm.

The following examples pertain to further aspects of the disclosure:

Example 1 is a semiconductor device comprising a semiconductor die including a front side surface, a backside surface opposite the front side surface and side faces; a backside metallization layer deposited over the backside surface and projecting laterally outwards beyond the side faces; and a side face protection layer covering the side faces.

In Example 2, the subject matter of Example 1 can optionally include wherein the thickness of the semiconductor die is equal to or less than 60 µm or 40 µm or 20 µm or 15 µm.

In Example 3, the subject matter of Example 1 or 2 can optionally include wherein the side face protection layer is a polymer layer.

In Example 4, the subject matter of any preceding Example can optionally include wherein the side face protection layer completely covers the side faces.

In Example 5, the subject matter of any preceding Example can optionally include wherein in a vertical projection an outline of the backside metallization layer surrounds an outline of the side faces.

In Example 6, the subject matter of any preceding Example can optionally include wherein the side face protection layer projects over the backside surface of the semiconductor die.

In Example 7, the subject matter of any preceding Example can optionally include wherein an outer side face of the side face protection layer has a laser-cut surface condition; and an outer side face of the backside metallization layer has a laser-cut surface condition.

In Example 8, the subject matter of any preceding Example can optionally include wherein the side face protection layer comprises a first sublayer and a second sublayer; the first sublayer overlaps with the side faces and does not overlap with the backside surface; and the second sublayer overlaps with the backside surface and an edge region of the side faces.

In Example 9, the subject matter Example 8 can optionally include wherein the first sublayer is spaced apart from a lower region of the side faces by a gap; and the gap is filled by the second sublayer.

In Example 10, the subject matter of Example 8 or 9 can optionally include wherein at least a portion of the backside metallization layer is spaced apart from the backside surface by the second sublayer.

Example 11 is a semiconductor arrangement, comprising a semiconductor device of any of the preceding Examples; a device carrier; and a solder layer arranged between the device carrier and the backside metallization layer to mount the semiconductor device to the device carrier, wherein in a vertical projection an outline of the solder layer surrounds an outline of the side faces.

In Example 12 is a method of manufacturing a semiconductor device, the method comprising forming grooves in a front side surface of a wafer; filling the grooves with a first side face protection material; thinning the wafer at a backside surface of the wafer opposite the front side surface; depositing a backside metallization layer over the backside surface of the thinned wafer; and laser cutting along the grooves through the side face protection material and through the backside metallization layer to separate the wafer into multiple semiconductor devices.

In Example 13, the subject matter of Example 12 can optionally include wherein thinning is carried out at least until the first side face protection material is exposed and forms a part of the backside surface of the thinned wafer.

In Example 14, the subject matter of Example 12 or 13 can optionally include roughening the backside surface of the thinned wafer before depositing the backside metallization layer.

In Example 15, the subject matter of any one of Examples 12 to 14 can optionally include applying a second side face protection material over the backside surface of the thinned wafer before depositing the backside metallization layer over the backside surface of the thinned wafer.

In Example 16, the subject matter of any of Examples 12 to 15 can optionally include wherein the backside metallization layer is left unstructured before laser cutting.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor die comprising a front side surface, a backside surface opposite the front side surface, and side faces;
a backside metallization layer in contact with at least part of the backside surface of the semiconductor die and projecting laterally outwards beyond the side faces of the semiconductor die; and
a protection layer in contact with at least part of the side faces of the semiconductor die,
wherein the backside metallization layer projects laterally outwards beyond the protection layer,
wherein in a vertical projection, an outline of the backside metallization layer surrounds an outline of the side faces of the semiconductor die.

2. The semiconductor device of claim 1, wherein the semiconductor die includes a vertical structure, and wherein the backside metallization layer is a load electrode of the semiconductor die.

3. The semiconductor device of claim 1, wherein the semiconductor die includes a horizontal structure, and wherein the backside metallization layer is a heat removal layer without electrical function as a load electrode.

4. The semiconductor device of claim 1, wherein the backside metallization layer is made of Cu, Al, AlCu, or AlSiCu.

5. The semiconductor device of claim 1, wherein the backside metallization layer supports the semiconductor die over the entire backside surface of the semiconductor die.

6. The semiconductor device of claim 1, wherein the backside metallization layer contacts and supports an edge region of the semiconductor die.

7. The semiconductor device of claim 1, wherein the protection layer completely covers the side faces of the semiconductor die.

8. The semiconductor device of claim 1, wherein the protection layer at least partly covers the front side surface of the semiconductor die.

9. The semiconductor device of claim 1, wherein the protection layer comprises a polymer material.

10. The semiconductor device of claim 1, wherein the protection layer comprises a ceramic material.

11. The semiconductor device of claim 1, further comprising:
a front side metallization layer at least partly covering the front side surface of the semiconductor die.

12. The semiconductor device of claim 11, wherein the front side metallization layer is made of a same material as the backside metallization layer.

13. The semiconductor device of claim 11, wherein the front side metallization layer and the backside metallization layer are made of different materials.

14. The semiconductor device of claim 11, wherein the protection layer at least partly covers side faces of the front side metallization layer.

15. The semiconductor device of claim 11, wherein the protection layer at least partly covers the front side metallization layer.

16. The semiconductor device of claim 1, wherein the semiconductor die has a thickness of 60 μm or less.

17. The semiconductor device of claim 1, wherein the backside metallization layer extends beyond the side faces of the semiconductor die by a length of 1 μm or more.

18. The semiconductor device of claim 1, wherein the backside metallization layer extends beyond the side faces of the semiconductor die by a length in a range of 2 μm to 20 μm.

19. The semiconductor device of claim 1, wherein a distance between each side face of the semiconductor die and an adjacent outer face of the protection layer is equal to or greater than or less than 1 μm, 2 μm, 5 μm, or 10 μm.

\* \* \* \* \*